United States Patent
Lee et al.

(10) Patent No.: US 12,441,608 B2
(45) Date of Patent: Oct. 14, 2025

(54) PROCESS AND APPARATUS FOR THE PREPARATION OF A BONDED SUBSTRATE

(71) Applicants: TOP TECHNOLOGY LTD, Pyeongtaek-si (KR); SHERKIN TECHNOLOGIES LIMITED, Dublin (IE)

(72) Inventors: Youngho Lee, Yongin-si (KR); Yongtae Kim, Yongin-si (KR); Sangbae Kim, Hwaseong-si (KR); Donal O'Sullivan, Dublin (IE)

(73) Assignees: TOP TECHNOLOGY LTD, Pyeongtaek-si (KR); SHERKIN TECHNOLOGIES LIMITED, Dublin (IE)

( * ) Notice: Subject to any disclaimer, the term of this patent is extended or adjusted under 35 U.S.C. 154(b) by 482 days.

(21) Appl. No.: 17/761,289

(22) PCT Filed: Sep. 21, 2020

(86) PCT No.: PCT/EP2020/076321
§ 371 (c)(1),
(2) Date: Mar. 17, 2022

(87) PCT Pub. No.: WO2021/053236
PCT Pub. Date: Mar. 25, 2021

(65) Prior Publication Data
US 2022/0340416 A1    Oct. 27, 2022

(30) Foreign Application Priority Data
Sep. 19, 2019  (KR) .......... 10-2019-0115273

(51) Int. Cl.
B29C 65/00    (2006.01)
B01L 3/00     (2006.01)
(Continued)

(52) U.S. Cl.
CPC .... B81C 99/0025 (2013.01); B01L 3/502707 (2013.01); B29C 66/00145 (2013.01);
(Continued)

(58) Field of Classification Search
None
See application file for complete search history.

(56) References Cited

U.S. PATENT DOCUMENTS

| | | | |
|---|---|---|---|
| 6,193,576 B1 * | 2/2001 | Gaynes | G02F 1/13336 445/24 |
| 2003/0173032 A1 * | 9/2003 | Lee | B32B 38/1841 156/580 |

(Continued)

FOREIGN PATENT DOCUMENTS

| | | |
|---|---|---|
| KR | 1020030043478 A | 3/2006 |
| KR | 1020110001117 A | 1/2011 |

(Continued)

OTHER PUBLICATIONS

PCT International Search Report dated Mar. 9, 2021 for Application No. PCT/EP2020/076321.

*Primary Examiner* — Christopher T Schatz
(74) *Attorney, Agent, or Firm* — Greer, Burns & Crain, Ltd.

(57) ABSTRACT

The present invention relates to a process and apparatus for the preparation of a bonded substrate. More particularly, the present invention relates to a PDMS bonding apparatus. More specifically, the present invention relates to a PDMS bonding apparatus which uses plasma to bond PDMS to a substrate.
The present invention discloses a PDMS bonding apparatus and process for using said apparatus, the apparatus comprising: a process chamber (100) forming a sealed processing space (S) for bonding of PDMS (polydimethylsiloxane); a first support (200) installed in the process chamber (100)

(Continued)

and which supports the PDMS (1); a second support (300) installed in the process chamber (100) opposing the first support (200) and which supports a bonding object (2) which is bonded to the PDMS (1); a gas injection unit (400) which ejects process gas between the first support (200) and the second support (300), and; a plasma generator (500) which creates a plasma atmosphere within the process chamber (100).

21 Claims, 8 Drawing Sheets

(51) Int. Cl.
  *B81C 3/00* (2006.01)
  *B81C 99/00* (2010.01)
  *H01J 37/32* (2006.01)
  *B29K 683/00* (2006.01)

(52) U.S. Cl.
  CPC ............ *B29C 66/028* (2013.01); *B29C 66/95* (2013.01); *B81C 3/001* (2013.01); *H01J 37/32183* (2013.01); *H01J 37/32568* (2013.01); *H01J 37/32715* (2013.01); *B01L 2200/12* (2013.01); *B01L 2300/123* (2013.01); *B29K 2683/00* (2013.01); *B81C 2203/037* (2013.01); *B81C 2203/051* (2013.01); *H01J 37/32825* (2013.01); *H01J 2237/20214* (2013.01); *H01J 2237/20235* (2013.01); *H01J 2237/20292* (2013.01)

(56) References Cited

U.S. PATENT DOCUMENTS

| | | | |
|---|---|---|---|
| 2006/0027318 A1* | 2/2006 | Hashizume | B32B 38/1841 156/285 |
| 2008/0017322 A1* | 1/2008 | Mitsumoto | B32B 38/18 156/538 |
| 2010/0156054 A1* | 6/2010 | Sun | C09J 11/04 279/142 |
| 2019/0312007 A1* | 10/2019 | Nagata | H01L 21/187 |

FOREIGN PATENT DOCUMENTS

| | | |
|---|---|---|
| KR | 20120097596 A | 9/2012 |
| KR | 1020190115273 | 9/2019 |

* cited by examiner

PROCESS AND APPARATUS FOR THE PREPARATION OF A BONDED SUBSTRATE

CROSS-REFERENCE TO RELATED APPLICATIONS

This is application is a U.S. national stage application of PCT/EP2020/076321 with the international filing date of Sep. 21, 2020, claiming the benefit of priority from KR 10-2019-0115273 filed Sep. 19, 2019, the entire disclosure of both applications is herein incorporated by reference.

FIELD OF THE INVENTION

The present invention relates to a process and apparatus for the preparation of a bonded substrate. More particularly, the present invention relates to a PDMS bonding apparatus. More specifically, the present invention relates to a PDMS bonding apparatus which uses plasma to bond PDMS or other microfluidic material to a substrate.

BACKGROUND TO THE INVENTION

PDMS is a commonly used material for the manufacture of microfluidic devices. PDMS (polydimethylsiloxane) is easy to fabricate and has excellent electrical, optical and mechanical properties, and as a result is widely used by various researchers and technology developers. In particular, PDMS has a characteristic of not only being able to stably adhere to a relatively large area of a substrate, but also being able to maintain stable adhesion to relatively uneven surfaces.

Further, PDMS has the benefits of outstanding moldability to allow for adhesion to substrates of various forms, and transparency to allow light transmittance. These benefits give the characteristic of being able to be bonded to a substrate while precisely aligned using a CCD camera.

Meanwhile, PDMS, which exhibits the above characteristics, has the disadvantages of decreased adhesion area with an adhesion object and increased surface profile as time exposed to air increases, substantially reducing adhesive force.

A further problem is that, when treating PDMS with plasma under conventional atmospheric pressure conditions, static charge occurring in gas at atmospheric pressure results in foreign material adhering to the PDMS, reducing adhesive force between the PDMS and the adhesion object.

Current methods for bonding PDMS or other similar microfluidic materials or substrates include the use of plasma to prepare the surface of the components to be bonded. The parts to be bonded may be placed under an atmospheric plasma, or in a plasma chamber under vacuum conditions. Once plasma processing is complete, the parts are removed and brought to an alignment station (e.g. microscope) where the parts are aligned and bonded manually by the operator. This multi-step approach typically leads to low yield, where the plasma pre-treatment effects can diminish over time, particles and contamination are picked up by the substrates while moving to the alignment station, and due to human error and lack of assisted alignment.

SUMMARY OF THE INVENTION

The present invention is directed to a process and apparatus for the preparation of a bonded substrate and ideally provides a PDMS bonding apparatus achieving outstanding adhesion of PDMS by performing the PDMS bonding process using plasma in a vacuum.

According to a first aspect, the present invention is directed to a PDMS bonding apparatus, the apparatus comprising: a process chamber (100) forming a sealed processing space (S) for bonding of PDMS (polydimethylsiloxane); a first support (200) installed in the process chamber (100) and which supports the PDMS (1); a second support (300) installed in the process chamber (100) opposing the first support (200) and which supports a bonding object (2) which is bonded to the PDMS (1); a gas injection unit (400) which ejects process gas between the first support (200) and the second support (300), and; a plasma generator (500) which creates a plasma atmosphere within the process chamber (100).

According to a second aspect, the present invention is directed to a process a process for the preparation of a bonded substrate comprising PDMS (1) and a bonding object (2) using the PDMS bonding apparatus of any of the preceding claims comprising
an alignment step to align the PDMS (1) and the bonding object (2);
a plasma surface treatment step; and
a bonding step;
which take place under vacuum within the sealed processing space (S) of the process chamber (100).

Advantageously, the bonding apparatus of the invention improves the yield of a bonded object/substrate (1 and 2) by enabling the alignment step, surface treatment step and bonding step to take place in a single process vessel, namely the process chamber (100), within the sealed processing space (S). Ideally, these steps are sequential. Advantageously, the bonding apparatus and process ensures that the time between the alignment step, surface treatment step and bonding step may be minimized to enable the highest possible bonding force to be used with accurate alignment. This improved process also enables complex microfluidic devices and other devices to be fabricated with high repeatability.

According to a third aspect, the present invention is directed to a microfluidic substrate bonding apparatus, the apparatus comprising: a process chamber (100) forming a sealed processing space (S) for bonding of said microfluidic substrate; a first support (200) installed in the process chamber (100) which supports a first microfluidic substrate (1); a second support (300) installed in the process chamber (100) opposing the first support (200) which supports a second microfluidic substrate (2) which is bonded to the first microfluidic substrate (1); a gas injection unit (400) which ejects process gas between the first support (200) and the second support (300), and; a plasma generator (500) which creates a plasma atmosphere within the process chamber (100).

According to a fourth aspect, the present invention is directed to a process for the preparation of a bonded substrate comprising a first and second microfluidic substrate (1, 2) using the apparatus of the invention comprising
an alignment step to align the first and second microfluidic substrate (1, 2);
a plasma surface treatment step; and
a bonding step;
which take place under vacuum within the sealed processing space (S) of the process chamber (100).

DETAILED DESCRIPTION OF THE INVENTION

It will be understood that, in general terms, the present invention relates to a process and apparatus for the preparation of a bonded substrate. This 'substrate to be bonded' or 'bonded substrate' comprises PDMS (1) or a first microfluidic substrate (1) and a bonding object (2) or second microfluidic substrate (2). Reference to PDMS (1) will be understood to be interchangeable with a first microfluidic substrate (1) and reference to a bonding object (2) will be understood to be interchangeable with a second microfluidic substrate (2). Additionally, the terms objects, components, substrates, materials and parts will be understood to be interchangeable. Within this specification any reference to parts/objects/components/materials to bonded or processed will be understood to be interchangeable with the term 'substrate to be bonded' or 'bonded substrate'.

In this specification, it will be understood that reference to the processing of PDMS and PDMS bonding apparatus is not limited to PDMS and may also include other microfluidic materials or substrates typically used in the fabrication of microfluidic devices, i.e. PDMS-like materials. PDMS (1) is a transparent thermoplastic polymer. Such microfluidic substrates may include (i) inorganic materials such as silicon, glass, and ceramics (ii) polymeric materials including thermoset and thermoplastic polymers such as polycarbonate (PC), Polymethyl methacrylate (PM MA), Polystyrene (PS) and polycyclo-olefin (PCO)s, and (iii) paper i.e. cellulose matrix. We postulate that all of these materials are compatible with the apparatus of the invention and associated process. The microfluidic substrate may have microfluidic channels, wells, capillaries or chambers disposed on the substrate, typically fabricated into the substrate.

It will be understood that PDMS is optically transparent and is a preferred material described herein. As PDMS is optically transparent it can be placed on the first support and viewed through the viewport via the aligning camera unit. However, non-transparent microfluidic substrates may also be used and typically they are mounted on the second support opposite the viewport/aligning camera unit.

In this specification, it will also be understood that the process gases used can be air, oxygen ($O_2$), Argon (Ar) and/or other common and inert process gases.

In this specification, it will also be understood that the plasma process is ideally a continuous RF plasma process. Continuous RF plasma is highly efficient in generating the process conditions for efficient ionization of the process gases for surface treatment. However, plasma may also be produced using pulsed RF, microwave, or DC power supplies.

In this specification, it will also be understood that plasma treatment is a preferred method. This has the advantage that it may be deployed in small and large form factors i.e. the process chamber and plasma generator may be scaled according to the size of the substrates to be bonded. Plasma treatment may also be active during the alignment process, further improving the efficiency of the process. However, alternative surface treatment methods may also be used. For example, an excimer lamp and associated UV emissions may be used for the surface treatment for PDMS and other microfluidic substrates, noting that the degree of activation is limited by the form factor of the excimer lamp. The use of an excimer lamp requires that the substrates to be bonded are exposed in the close vicinity of the lamp surface (within 5 mm for optimum results). This physical proximity can limit the alignment and bonding processing of the substrates, so plasma treatment is the preferred method.

In this specification, it will be understood that the term 'camera' covers a device with an integrated lens or a stand-alone camera with separate lens.

In this specification, it will be understood that the first support (200) or second support (300) may be installed at any position within the process chamber (100) so long as they are opposite each other. Additionally, or alternatively, the first and second support may support any substrate, either the same or different substrate materials. At least one of the first and second microfluidic materials will be transparent or partially transparent in an alignment region corresponding to the viewport.

As defined above, according to a first aspect, the present invention is directed to a PDMS bonding apparatus, the apparatus comprising: a process chamber (100) forming a sealed processing space (S) for bonding of PDMS (polydimethylsiloxane); a first support (200) installed in the process chamber (100) and which supports the PDMS (1) or bonding object (2); a second support (300) installed in the process chamber (100) opposing the first support (200) and which supports a bonding object (2) which is bonded to the PDMS (1) or the PDMS (1) bonded to the bonding object (2); a gas injection unit (400) which ejects process gas between the first support (200) and the second support (300), and; a plasma generator (500) which creates a plasma atmosphere within the process chamber (100).

Additionally comprised may be a vacuum pump (610) which is installed in a manner connected with the process chamber (100) so that the processing space (S) maintains a vacuum state.

The first support (200) and the second support (300) may be installed vertically inside the process chamber (100), at the top and the bottom, respectively.

The first supporting plate (220) and the second supporting plate (320), may be made of the same material or different materials. Typically, the material may be quartz or other rigid, transparent materials with good optical properties; or a metal. Each of these materials must be compatible with plasma.

For example, the first supporting plate (220) (which is typically adjacent to the chamber viewport (130)) may be made of quartz or any other suitable rigid, transparent material with good optical properties. Alternative materials may include, sapphire, insulators such as Teflon™, ceramic materials or even a metal plate with a transparent area corresponding to the viewport (222). In this example, the second supporting plate (320) (opposite the chamber viewport (130)) may be metallic and may optionally have an integrated magnet/electromagnet.

The first support (200) may comprise a plurality of supporting pins (210) installed on the bottom inner face of the process chamber (100), and a first supporting plate (220) which is supported by the plurality of supporting pins (210) and on which the PDMS (1) is ideally seated.

As discussed above, in certain embodiments, the first supporting plate (220) may be a quartz plate or similar material with good optical properties. However, this type of material is fragile. As the supporting pins (210) may be metallic, the force of the second support (300) can exert pressure on the first supporting plate (220) and cause it to fracture. To prevent damage to the first supporting plate (220), the supporting pins (210) may also comprise a resilient member, preferably a spring, more preferably a compression spring. For example, a spring plunger may be used. Other resilient members which may be used include an elastomeric/rubber material, pneumatic apparatus and/or rubber damper. This resilient member acts to dampen the force between the second support (300) and the first support (200) during the bonding process. This ensures that the bonding process can be completed safely by reducing pressure on the first supporting plate (220).

The second support chamber (300) may comprise: a support shaft (310) which is installed to penetrate through the upper face of the process chamber (100); a second supporting plate (320) installed in the processing space (S) connected to the support shaft (310) and to which the bonding object (2) is ideally fixed, and; a support shaft drive unit (330) which drives the support shaft (310).

The support shaft drive unit (330) may, to align the PDMS (1) and the bonding object (2), be able to drive the support shaft (310) in at least one of an X-axis direction, Y-axis direction and Z-axis direction, where the up-down direction of the process chamber (100) is the Z-axis direction.

The support shaft drive unit (330) may be able to rotate the support shaft (310) with respect to an imaginary central axis of the support shaft (310), the imaginary central axis parallel to the Z-axis direction.

The plasma generator (500) may comprise an electrode unit (510) installed in the processing space (S) at a height between those of the first support (200) and the second support (300), and a power source (520) which is electrically connected to the electrode unit (510) and which supplies RF power to the electrode unit (510). The electrode unit (510) may be fixedly installed on an inner face of the process chamber at a position between the first and second support.

The plasma generator (500) may comprise a matcher (530) which is installed between the power source (520) and the electrode unit (510) and which controls the plasma within the processing space (S).

Additionally included may be an aligning camera unit (700) which is installed outside the process chamber (100) on an imaginary straight line linking the PDMS (1) and the bonding object (2) and which checks the alignment of the PDMS (1) and the bonding object (2). The alignment camera (710) will ideally be adjacent to the chamber viewport (130).

The apparatus of the invention may additionally include a force transducer. Ideally, the force transducer is part of the first support (200), for example located within the supporting pins (210) or it may be integrated into the second support (300).

The apparatus of the invention may additionally include one or more limit switches as part of the first support (200), for example located in one or more supporting pins (210) or it may be integrated into the second support (300). Optionally, the limit switch may be a mechanical switch, optical sensor or proximity sensor, with an output signal preferably connected to the motor drive electronics of the apparatus to disable the motor movement of the supports; connected to an indicator light or audible warning system; or monitored by software.

The apparatus of the invention may additionally comprise one or more lights and/or one or more cameras to illuminate the substrates to be bonded.

The PDMS bonding apparatus according to the present invention, wherein the bonding between PDMS or between a PDMS and a substrate occurs in a vacuum, has the benefits of outstanding adhesive force due to excellent PDMS surface modification and greater contact area.

Further, the PDMS bonding apparatus according to the present invention has the benefit of outstanding adhesive force at the PDMS surface through surface modification of PDMS with a plasma atmosphere.

Further, the PDMS bonding apparatus according to the present invention, being equipped with a camera for checking alignment between PDMS or between a PDMS and a substrate, and a drive unit for precise aligning, has the benefit of allowing for bonding of bonding objects at precise positions.

Further, the PDMS bonding apparatus according to the present invention, wherein plasma treatment of PDMS occurs in a vacuum, has the benefit of preventing adhesion of foreign material to the PDMS due to static charge, thereby increasing adhesive force with an adhesion object.

As defined above, according to a second aspect, the present invention is directed to a process for the preparation of a bonded substrate comprising PDMS (1) and a bonding object (2) using the PDMS bonding apparatus of the invention comprising an alignment step to align the PDMS (1) and the bonding object (2);

a plasma surface treatment step; and a bonding step;

wherein each step takes place under vacuum within the sealed processing space (S) of the process chamber (100).

Ideally, the alignment step, plasma surface treatment step and bonding step are sequential. The process may further comprise an optional post-treatment alignment verification step prior to the bonding step.

One of the advantages of this process taking place under vacuum within the sealed processing space (S) of the process chamber (100) is that the duration between the plasma surface treatment step, the optional post-treatment alignment step and the bonding step may be minimized, preferably to under 1 minute.

The process also comprises a release step where the process chamber (100) is vented to atmospheric pressure and the bonded substrate is released by the first or second support (300).

According to a preferred embodiment, the process comprises the following steps

Placing at least one bonding object (2) and at least one PDMS (1) into the process chamber (100);

Applying a vacuum;

Aligning a bonding object (2) and PDMS (1) in the sealed processing space (S);

Subjecting said bonding object (2) and PDMS (1) to a plasma treatment step;

Carrying out an optional post-treatment alignment check;

Carrying out a bonding step to result in a bonded object; and

Releasing the vacuum and bonded object and removing the bonded object from process chamber (100).

This process is equally applicable to a process for the preparation of multiple or multi-layered bonded objects in a single processing step without the need to remove and reapply vacuum conditions in the sealed processing space (S) of process chamber (100) between each alignment, surface treatment and bonding step. For example, the process may involve the placing of two or more bonding objects (2) and two or more PDMS (1), simultaneously or sequentially, in the processing space of the process chamber (100); applying a vacuum, followed by multiple alignment, treatment and bonding steps in the sealed processing space (S) of process chamber (100) to form multiple bonded objects or multi-layered bonded objects. Once the multiple/multi-layered bonded objects are formed, vacuum conditions in the sealed processing space (S) of process chamber (100) may be released and multiple bonded objects can then be removed in a single step.

The first and seconds aspects of the invention are discussed in relation to PDMS (1) and a bonding object (2) but are equally applicable to any microfluidic substrate as discussed below.

According to a third aspect, the present invention is directed to a microfluidic substrate bonding apparatus, the apparatus comprising: a process chamber (100) forming a sealed processing space (S) for bonding of said microfluidic substrate; a first support (200) installed in the process chamber (100) which supports a first microfluidic substrate (1); a second support (300) installed in the process chamber (100) opposing the first support (200) which supports a second microfluidic substrate (2) which is bonded to the first microfluidic substrate (1); a gas injection unit (400) which ejects process gas between the first support (200) and the second support (300), and; a plasma generator (500) which creates a plasma atmosphere within the process chamber (100).

In this aspect, the first microfluidic substrate (1) corresponds to the PDMS (1) as described above and the second microfluidic substrate corresponds to the bonding object (2) described above. All the features described above in relation to PDMS (1) and the bonding object (2) will be applicable to the first and second microfluidic substrate of this aspect of the invention.

The microfluidic substrate may be any suitable microfluidic material typically used in microfluidic manufacture, for example in the manufacture of microfluidic devices which may be used for a variety of biological processes, such as screening putative biologically active molecules against cell cultures or separating biological materials in lab-on-chip systems etc.

Accordingly, the microfluidic substrates of the invention may be selected from the following microfluidic materials including:
  inorganic materials such as silicon, glass and ceramics;
  polymeric materials, including thermoset and thermoplastic polymers; and/or
  paper i.e. cellulose matrix.

The microfluidic substrate may have microfluidic channels, wells, capillaries or chambers disposed on the substrate, typically fabricated into the substrate. Transparent polymeric materials are particularly preferred such as quartz, pyrex, PMMA, PDMS and other transparent polymers. PDMS (1) is a transparent thermoplastic polymer. The polymeric materials may exclude PDMS. Other particularly preferred substrates include glass substrates for LCD panels, substrates for OLED panels, solar cell substrates and semiconductor substrates. The first and second microfluidic substrates may be the same or different microfluidic materials.

At least one of the first and second microfluidic substrates will be transparent or partially transparent. The microfluidic substrate which is adjacent to the viewport (222) will ideally be transparent or partially transparent in an alignment region corresponding to the viewport (222). This facilitates the user of the apparatus to align the first and second substrates through the viewports (130, 222) and aligning camera unit (1). Accordingly, the substrate located opposite the viewports (130, 222) and aligning camera unit (700) may be non-transparent.

According to a fourth aspect, the present invention is directed to a process for the preparation of a bonded substrate comprising a first and second microfluidic substrate (1, 2) using the apparatus of the invention comprising
  an alignment step to align the first and second microfluidic substrates (1, 2);
  a plasma surface treatment step; and
  a bonding step;
which take place under vacuum within the sealed processing space (S) of the process chamber (100).

It will be understood that the plasma generator, which creates a plasma under vacuum within the process chamber, may be replaced by an alternative surface treatment method, for example excimer lamp surface treatment.

One of the advantages of this process taking place under vacuum within the sealed processing space (S) of the process chamber (100) is that the duration between the plasma surface treatment step, the optional post-treatment alignment step and the bonding step may be minimized, preferably to under 1 minute.

Ideally, the alignment step, plasma surface treatment step and bonding step are sequential. The process may further comprise an optional post-treatment alignment verification step prior to the bonding step. The process also comprises a release step where the process chamber (100) is vented to atmospheric pressure and the bonded substrate is released by the first or second support (200, 300).

According to a preferred embodiment, the process comprises the following steps
  Placing at least one first microfluidic substrate (1) and at least one second microfluidic substrate (2) into the process chamber (100);
  Applying a vacuum;
  Aligning a first microfluidic substrate (1) and second microfluidic substrate (2);
  Subjecting said first microfluidic substrate (1) and second microfluidic substrate (2) to a plasma treatment step;
  Carrying out an optional post-treatment alignment check;
  Carrying out a bonding step to result in a bonded substrate; and
  Releasing the vacuum and bonded object and removing the bonded object from process chamber (100).

Other advantageous features of the invention will be described below. It will be understood that these features are not mutually exclusive and may be combined with any of the above-described first to fourth aspects and features.

Excessive force on the substrates (i.e. PDMS/first microfluidic substrate (1) and bonding object/second microfluidic substrate (2)) may cause deformation and, for example, collapse of microchannels or other microstructures present. Furthermore, excessive force may cause damage to the first and second supports (200, 300) and associated supporting plates. Accordingly, the apparatus of the invention may additionally include a force transducer. Ideally, the force transducer is integrated into the supporting pins (210) or may be integrated into the second support (300). Accordingly, this force transducer is designed to detect when the substrates (first microfluidic substrate/PDMS (1) and a second microfluidic substrate/bonding object (2)) and associated supports have come into contact; and to monitor and measure that a force is being exerted on both first and second supports (200, 300). This assists the user to control and limit the force exerted on the substrates. Thus, in use the force transducer will alert the operator about the contact of the substrates and help to ensure optimum yield of bonded components.

The force exerted on the first supporting plate (220) arises from the second support (300) as it pushes the substrates together. These substrates may be fragile e.g. fragile components with thin walls, microchannels or other microstructures. Thus, the control of bonding pressure/force is an important feature. Accordingly, the apparatus of the invention may additionally include one or more limit switches located in or integral to one or more supporting pins (210). Optionally, the limit switch may be a mechanical switch preferably connected to the motor drive electronics to disable the motor movement; an indicator light or audible warning system; or monitored by software. In order to detect that the substrates have been bonded and to prevent additional force being exerted on the bonded substrates, a limit switch may be installed in one or more supporting pins (210) to limit the distance travelled by the driven second support in order to prevent the second supporting plate (320) from exceeding the required pressure to bond the substrates, which can lead to substrate deformation or support plate damage. Ideally, the limit switch may be any mechanical switch or detector, which may be connected to the motor drive electronics to disable the motor movement. Alternatively, it may be connected to an indicator light or audible warning system to alert the operator. Still alternatively, the limit switch may be monitored by software to alert the user in the machine user interface.

According to one embodiment, the force transducer and limit switch functionality may be combined in one or more supporting pins (210) of the first support (200). Alternatively, they may be integrated into the second support (300).

The substrate to be bonded, comprising a first microfluidic substrate/PDMS (1) and a second microfluidic substrate/bonding object (2) may be interchangeably fixed to the first or second supports, specifically the first supporting plate (220) or the second supporting plate (320). Alternatively, it may be simply placed on the first or second supports with a need for an additional fixing means. For example, when the first support (200) is installed on the bottom inside face of the process chamber (100), the substrate may be placed on the support (200)/supporting plate (220) without the need for additional fixing means. In this scenario, the second support (300) is installed opposite this position on the top inside face of the process chamber (100). More specifically, the second support (300) may be installed vertically inside and toward the top of the process chamber (100). Accordingly, the substrate must be attached to the second support (300)/supporting plate (320) via a clamping or other mechanical means (e.g. mechanical clamp), via an adhesive means and/or via a magnet/electromagnet.

Both the first and second supporting plate (220, 320) are typically not permanently fixed to their respective supports shafts and are preferably removable. For example, the first supporting plate (220) may be lifted, usually manually be the operator, to remove the bonded substrate once the process chamber (100) has been vented (i.e. brought to atmosphere). Additionally, it will be understood that the second support (300) comprises a support shaft (310) and a second supporting plate (320) with a second supporting plate seating face (321). The second supporting plate (320) may be attached to the second support shaft (310) via a magnet and released using an electromagnet. It will be understood that typically the method to remove or release the bonded substrate or object involves releasing the second supporting plate, followed by removal of the first supporting plate with the bonded substrate or object and second supporting plate attached.

The apparatus of the invention may additionally comprise one or more lights and/or one or more cameras to illuminate and view the substrates to be bonded.

For example, a first light (e.g. main ring light) may be installed in line with the aligning camera unit (700) used to capture an image of the substrates to be bonded. This light may be dimmable under operator control to optimize the image under inspection and to detect the fine lines and fiducials which may be used to align the parts to be bonded.

Additional lights and/or cameras may also be installed to illuminate separate components of the apparatus of the invention, for example, chamber sidewalls, fiducials, markings for improved orientation and alignment of the parts to be bonded. This is particularly advantageous for transparent components, where the use of additional lighting may help to contrast the relevant alignment features and improve the accuracy of the process.

A second light may be installed on a side wall of the chamber (100, 110) which casts light horizontally across the substrates to be bonded. The incident light from the first light (main ring light) which is in line with the camera will be at 90 degrees on average from the second light.

Additional light sources may be installed to improve the clarity of objects in the process chamber (100), improve contrast of areas of interest on the substrates to be bonded, and improve the monitoring capabilities with additional cameras.

For example, a light may be installed inside or outside the process chamber (100) (for example, on chamber lid 120) to illuminate the substrates to be bonded from a different angle. This may also be dimmable to control the luminescence of the light.

In general terms, the use of high-performance lens or camera to produce a flat, low-distortion image of the substrates to be processed/bonded is contemplated. This improves the alignment of substrate across the image and reduces error in alignment.

An additional camera could be mounted on the process chamber (100) sidewall to give the operator a view of the substrates to be bonded from the side. Alternatively, an additional camera may be installed on the chamber lid (120).

The use of additional cameras assists as the bonding operation is in progress to give an indication of the distance between the substrates to be bonded, improves the monitoring of the process by the operator and confirms the location of all substrates within the process chamber (100).

To further assist with the alignment of parts, alignment marks or guides such as fiducials may be present on the substrates to be bonded (first microfluidic substrate/PDMS (1) and a second microfluidic substrate/bonding object (2)) to facilitate their alignment to each other. Alignment marks or guides may also be placed on the first and second supports (200, 300) to facilitate alignment with the substrates to be bonded. Substrate features, e.g. microchannels, wells, sidewalls etc., may be used as an aid during the alignment process, however, the use of additional alignment marks or guides will improve the accuracy of the alignment.—Alignment markings may be included in the molding process when the substrates are being fabricated, cut into the substrates after molding, or may be printed on the substrates.

Although the process described above in relation to the second and fourth aspect of the invention, relates to a process using a first microfluidic substrate/PDMS (1) and a second microfluidic substrate/bonding object (2), it will be understood that the process may also involve multiple first microfluidic substrates/PDMS (1) and multiple second microfluidic substrates/bonding objects (2).

For example, multiple substrates may be bonded during a single processing cycle by loading the supporting plates (220, 320) with multiple substrates and using the X, Y, R and/or Z axis movement associated with the first and/or second supports. In this manner, the alignment, treatment and bonding steps are performed multiple times e.g. bond the substrates on first and second supporting plates, lift the bonded substrate from the first supporting plate, move the first and/or second support to bring the next pair or set of substrates to be bonded into the alignment area, and repeat the process, without the need to remove and reapply vacuum conditions to load/unload bonded substrates from the sealed processing space (S) of the process chamber.

Alternatively or additionally, multi-layer substrates can be made, where a first and second microfluidic substrate are bonded and the bonded substrate then acts as the starting substrate for a further alignment, treatment and bonding step.

Finally, the process may be automated using conventional technology for the integration of handling, loading, transfer and unloading of substrates/bonded substrates. This is shown in FIG. 8.

BRIEF DESCRIPTION OF THE DRAWINGS

In the following, the PDMS/microfluidic substrate bonding apparatus according to the present invention will be explained with reference to the attached drawings and description.

As illustrated in FIG. 1, the PDMS bonding apparatus according to the present invention comprises: a process chamber (100) forming a sealed processing space (S) for bonding of PDMS (polydimethylsiloxane); a first support (200) installed in the process chamber (100) and which supports the PDMS (1); a second support (300) installed in the process chamber (100) opposing the first support (200) and which supports a bonding object (2) which is bonded to the PDMS (1); a gas injection unit (400) which ejects process gas between the first support (200) and the second support (300), and; a plasma generator (500) which creates a plasma atmosphere within the process chamber (100).

Figure 1:
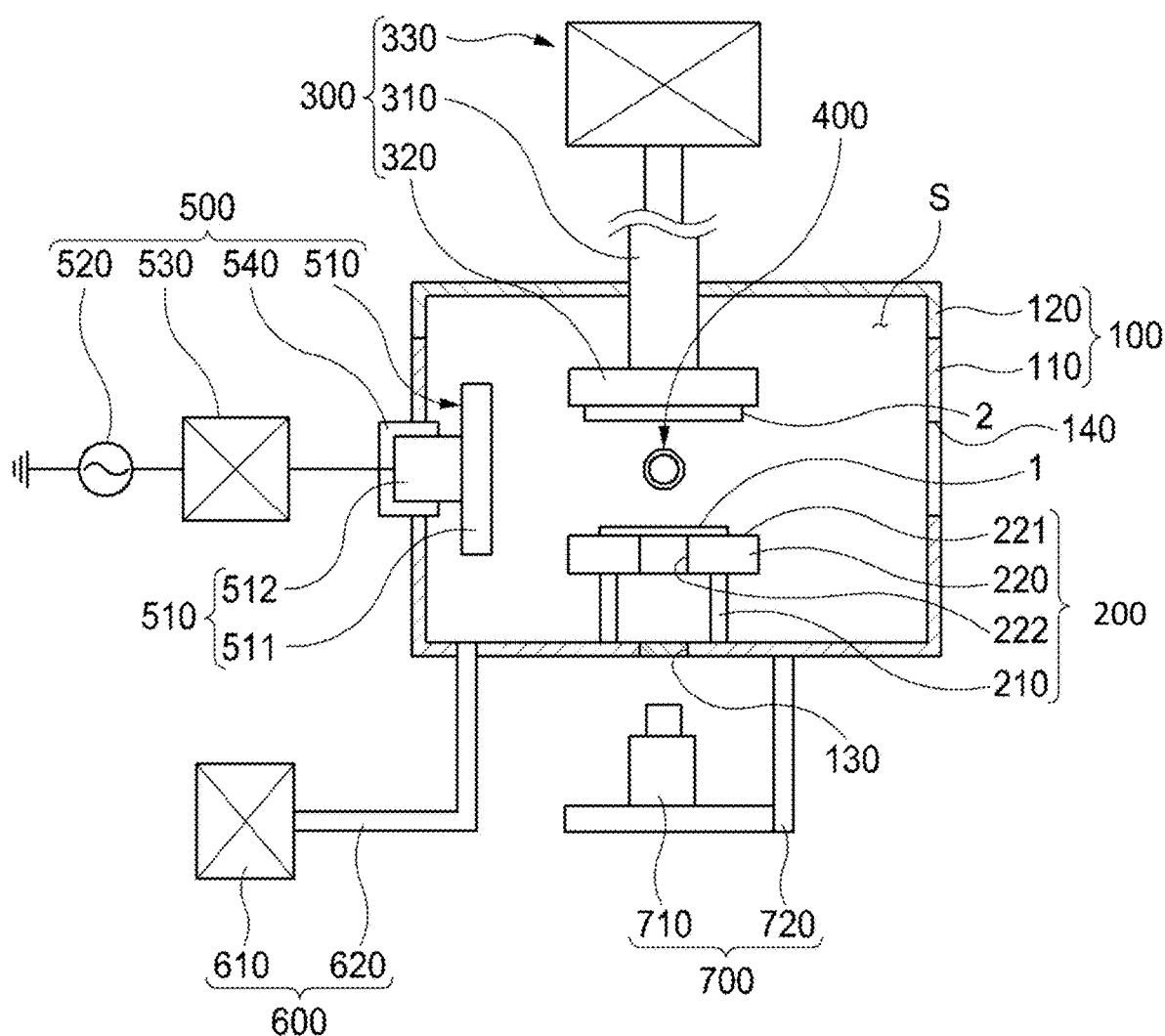
FIG. 1 is a cross section depicting the PDMS bonding apparatus according to the present invention.
Figure 2:
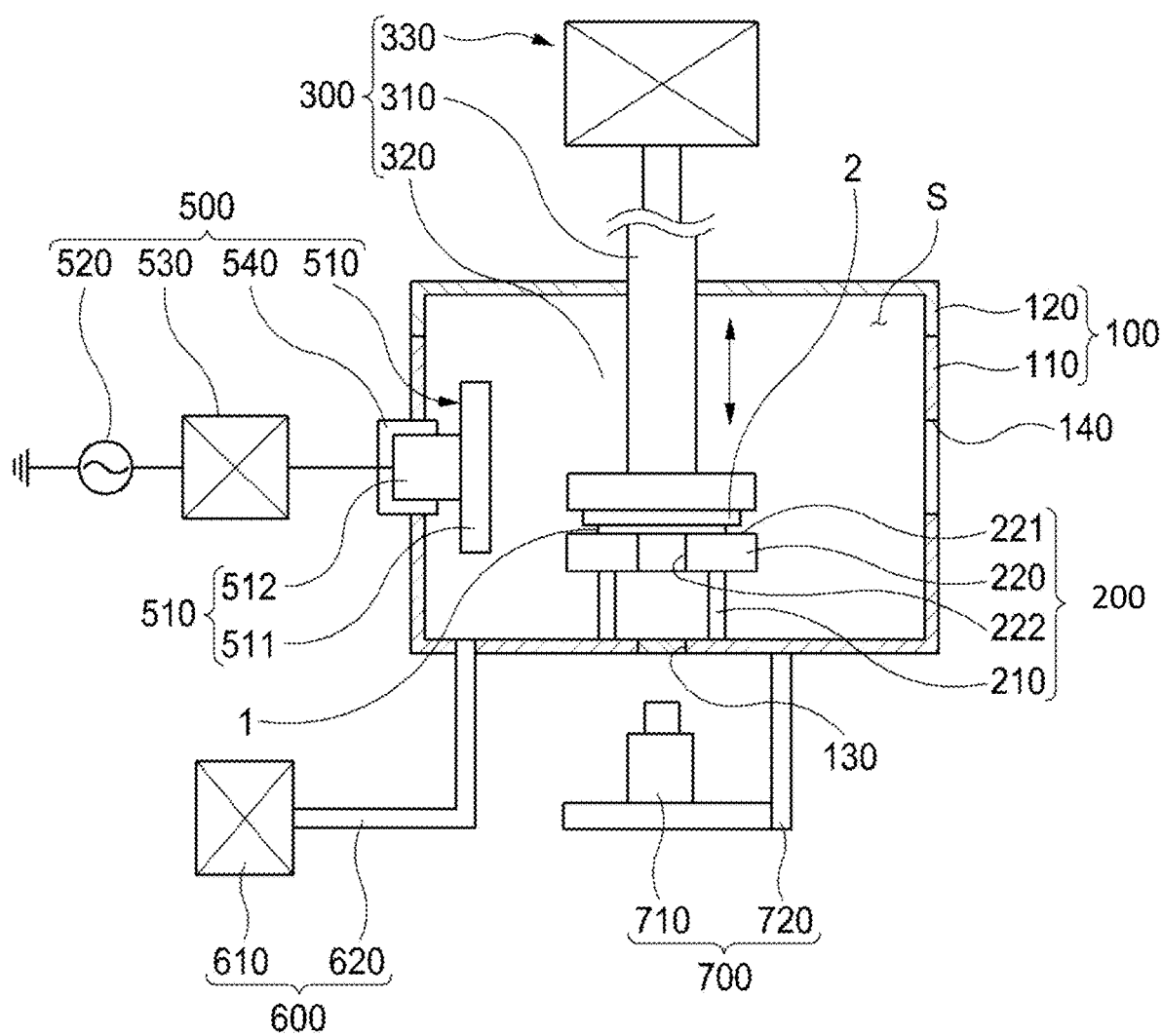
FIG. 2 is a cross section depicting the PDMS bonding apparatus of FIG. 1 when bonding.
Figure 3:
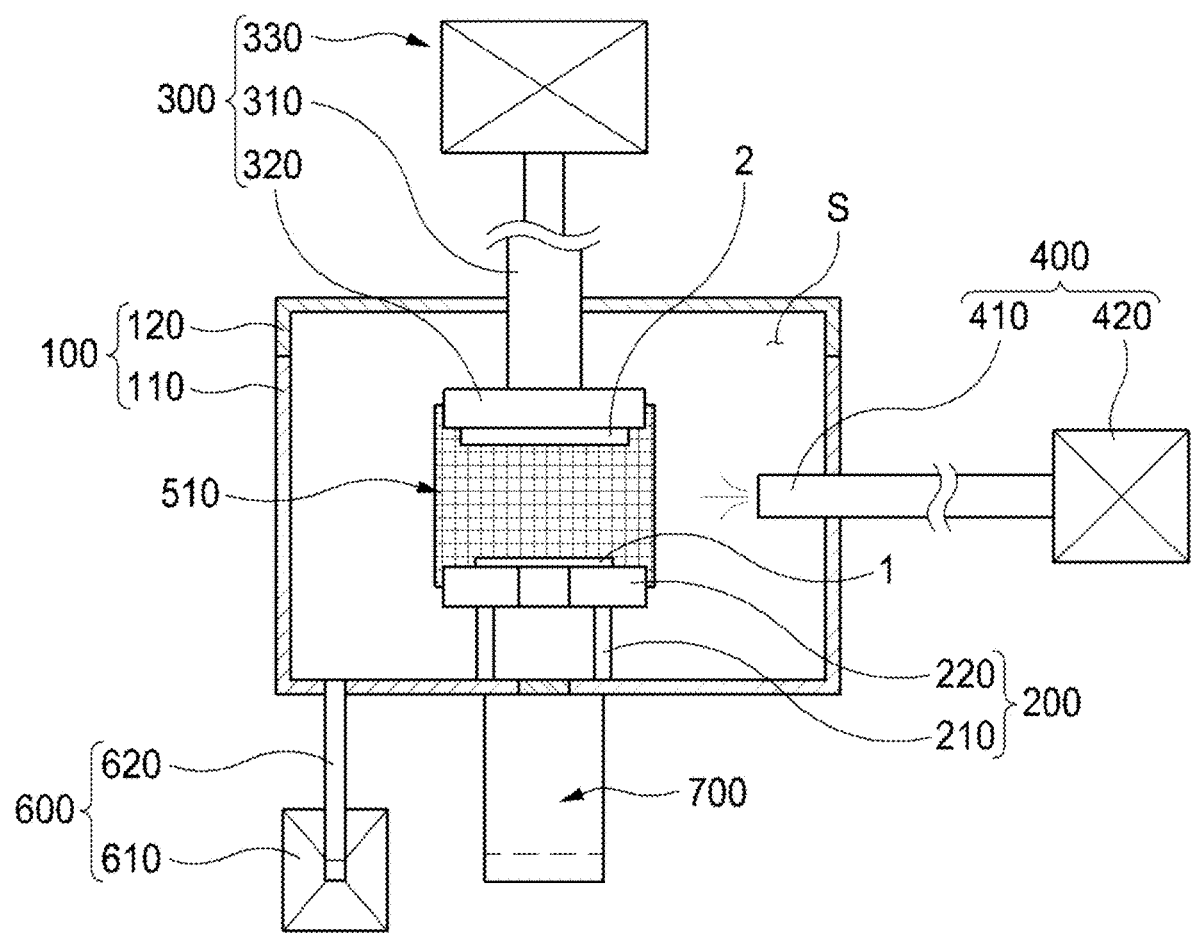
FIG. 3 is a cross section depicting the PDMS bonding apparatus of FIG. 1.
Figure 4:
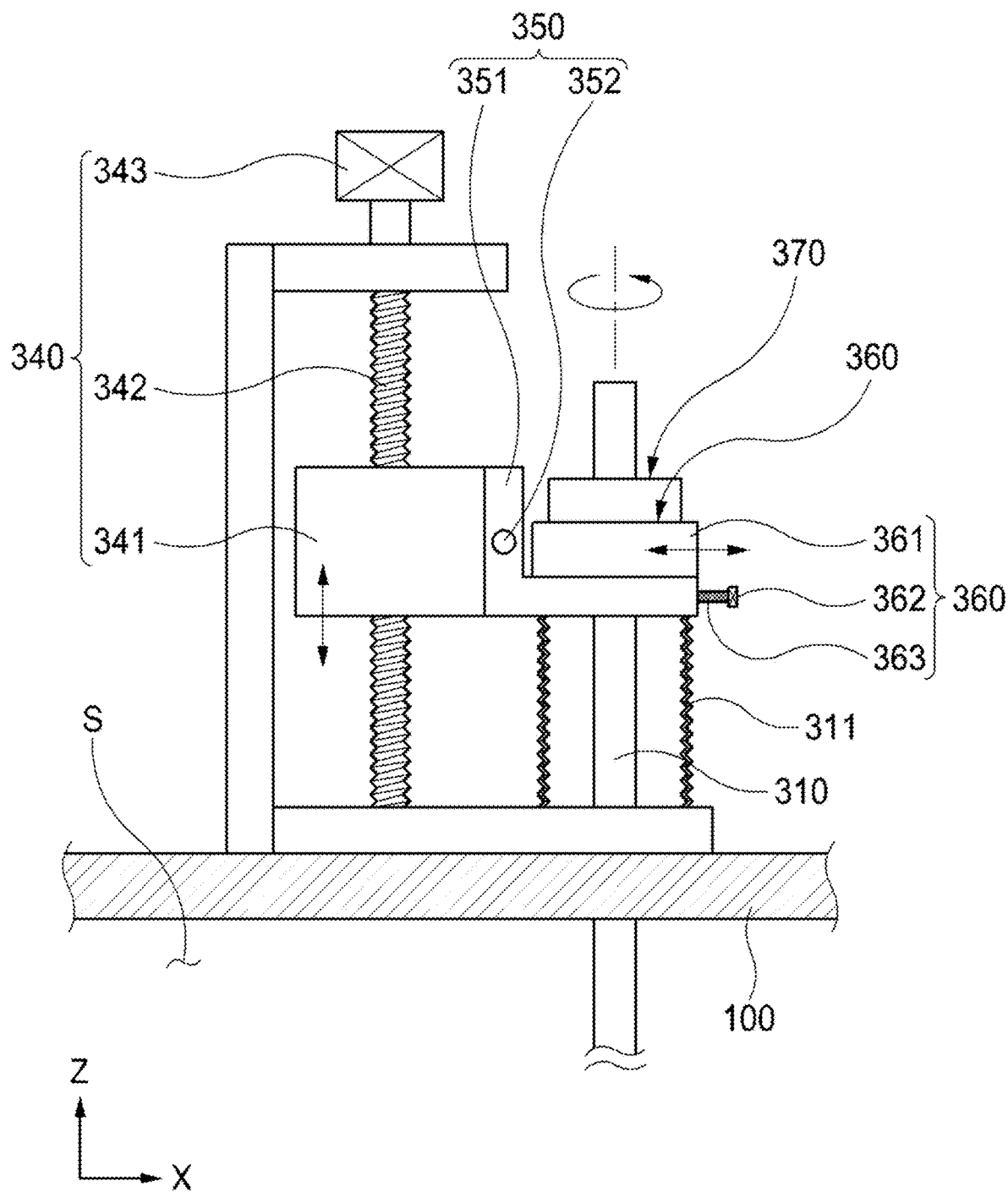
FIG. 4 is a cross section depicting the support shaft drive unit of the PDMS bonding apparatus of FIG. 1.

Further, the PDMS bonding apparatus according to the present invention, as illustrated in FIG. 1, may comprise a vacuum pump (610) which is installed in a manner connected with the process chamber (100) so that the processing space (S) maintains a vacuum state.

Further, the PDMS bonding apparatus according to the present invention, as illustrated in FIG. 1, may comprise an aligning camera unit (700) which is installed outside the process chamber (100) on an imaginary straight line linking the PDMS (1) and the bonding object (2) and which checks the alignment of the PDMS (1) and the bonding object (2).

The PDMS (1) according to the present invention is polydimethylsiloxane, a material with outstanding thermal stability, excellent UV resistance and high gas and light transmittivity, as well as excellent insulating performance.

Based on these characteristics, PDMS (1) may be used for various applications, including as a release agent, in rubber molds, as a surfactant, as a water repellent, as an adhesive, as a foam control agent, in biomedical devices, in personal sanitary supplies and cosmetics, for encapsulation of dielectric materials, as a glass sizing agent, in hydraulic hoses, in heat transfer oils, in lubricants, in fuser oils, in preparation for protecting bricks, and in process aids.

In particular, the PDMS (1), being a material with a modified surface and outstanding adhesive strength, may be bonded to semiconductor substrates, glass substrates for LCD panels, substrates for OLED panels, solar cell substrates and PDMS.

The process chamber (100) according to the present invention, which is an element which forms a sealed processing space (S) for bonding of PDMS (1), may be configured in various ways.

For example, the process chamber (100) may be configured as a single chamber having a sealed internal processing space (S). In another example, it may include a chamber body (110) with an open top, and a lid (120) which is coupled to the top of the chamber body (110) to form a sealed processing space (S).

Further, the process chamber (100) may be equipped with a gate (140) for inserting a PDMS (1) and bonding object (2) into a processing space (S) for processing, and in another example, a lid (120) may be opened for placing a PDMS (1) and a bonding object (2) inside.

In one example, the element of a process chamber (100) may be a cube-shaped element with an internal space, connected with a vacuum pump (610) to be explained below in order to maintain an internal vacuum.

Meanwhile, the process chamber (100) may keep the processing space (S) in a vacuum state through a vacuum pump (610) to be explained below, thereby magnifying the PDMS (1) surface modification effect of the plasma and in turn improving adhesion with a bonding object (2).

Further, the process chamber (100) may have a chamber view port (130) at a position opposite the position at which the aligning camera unit (700) is installed, so as to allow light emitted from the aligning camera unit (700) to be explained below to pass through.

That is, the process chamber (100) may have a chamber view port (130) formed on an imaginary straight line linking an aligning camera unit (700) and the PDMS (1) so as to allow the alignment of the PDMS (1) and the bonding object (2) to be checked using the aligning camera unit (700).

For example, the chamber view port (130) may be formed at the bottom face of the process chamber (100) opposite an aligning camera unit (700) installed beneath the process chamber (100).

Further, the process chamber (100) may be configured so that the sides are electrically connected to an external earthing terminal, so that an electrical field is formed by an electric potential difference with an electrode unit (510) of a plasma generator (500) to be explained below, forming a plasma atmosphere in the processing space (S).

The first support (200) is an element which is installed in the process chamber (100) and which supports the PDMS (1), and may be configured in various ways.

For example, the first support (200) may be installed on the floor surface inside the process chamber (100), thereby supporting a PDMS (1) which is seated thereon.

Meanwhile, in another example, the first support (200) may be installed on the ceiling face of the process chamber (100), and the PDMS (1) may be secured thereto and supported thereby.

That is, the first support (200) may be installed at any position within the process chamber (100) so long as its position is opposite that of a second support (300) to be explained below, and may also be installed at the sides inside the process chamber (100).

For example, the first support (200) may be installed inside and at the bottom of the process chamber (100) vertically beneath the second support (300) to be explained below, and may comprise a plurality of supporting pins (210) installed on the inner bottom face of the process chamber (100), and a first supporting plate (220) supported by the plurality of supporting pins (210) and on which the PDMS (1) is seated.

In this case, the first support (200) may be an element comprising a plurality of supporting pins (210) installed on the inner bottom face of the process chamber (100), and a first supporting plate (220) supported by the plurality of supporting pins (210) and on which the PDMS (1) is seated, or may comprise just a plurality of supporting pins (210), with the plurality of supporting pins (210) supporting the PDMS (1).

The plurality of supporting pins (210) are an element installed on the floor of the process chamber (100), and as such may be associated with the first (100) or second (200) supports depending on their position within the process chamber (100), and may be configured in various ways.

For example, the plurality of supporting pins (210) may be arranged to form an overall circle on the floor of the process chamber (100) and protrude upwards, and may support the edges of the PDMS (1) so that light from an aligning camera unit (700) to be described below passes through the PDMS (1) and reaches the bonding object (2).

In this case, the plurality of supporting pins (210) may be arranged to form a circle corresponding to the size of the PDMS (1), and stably support the PDMS (1) by supporting the edges of the PDMS (1). In another example, they may support the edges of a first supporting plate (220).

Meanwhile, the plurality of supporting pins (210) is preferably three or more pins, to ensure stable support for the PDMS (1) or the first supporting plate (220).

The first supporting plate (220) is an element which is supported by a plurality of supporting pins (210) and on which the PDMS (1) is seated, and may be configured in various ways.

For example, the first supporting plate (220) may be fixed on top of the plurality of supporting pins (210) and supported thereby, and a first supporting plate seating face (221) may be formed on the upper face to accommodate the PDMS (1) to stably seat the PDMS (1).

Meanwhile, the first supporting plate (220) may have a view port (222) formed at a position opposite the chamber view port (130) so that light from the aligning camera unit (700) which has passed through the chamber view port (130) may pass through the PDMS (1) and reach the bonding object (2).

Further, the first supporting plate (220) may be connected to an earthing terminal and used as an earthing electrode so as to form a plasma atmosphere between it and the electrode unit (510) of the plasma generator (500) to be explained below.

That is, the first supporting plate (220), by being electrically connected to an external earthing terminal, may provide a ground connection within the process chamber (100), and this allows for an electrical field to be formed between it and the electrode unit (510) to be explained below, in turn forming a plasma atmosphere.

The second support (300) is an element which is installed opposite the first support (200) in the process chamber (100) and which supports a bonding object (2) which is bonded to the PDMS (1), and may be configured in various ways.

For example, the second support (300) may be installed at a position opposite the position where the first support (200) is installed, and may be installed anywhere on the process chamber (100), including at the top, bottom or on the sides, so long as the position is opposite that of the first support (200).

That is, the second support (300), in a case where the first support (200) is installed on the bottom inside face of the process chamber (100), may be installed opposite this position on the top inside face of the process chamber (100). More specifically, it may be installed vertically inside and toward the top of the process chamber (100).

In this case, the second support (300) may be installed through a top lid (120).

More specifically, the second support (300) may comprise a support shaft (310) which is installed through the upper face of the process chamber (100), a second support plate (320) which is connected to the support shaft (310) and installed in the processing space (S) and on which the bonding object (2) is secured, and a support shaft drive unit (330) which drives the support shaft (310).

The support shaft (310) is an element which is installed through the top face of the process chamber (100), and may be configured in various ways.

For example, the support shaft (310) may be connected to the support shaft drive unit (330) outside the process chamber (100) at one end, with the opposite end connected to the second supporting plate (320) inside the process chamber (100), so that the support shaft drive unit (330) drives the second supporting plate (320).

The second supporting plate (320) is an element which is installed in the processing space (S) and connected to the support shaft (310), whereon the bonding object (2) is secured. It may be configured in various ways.

For example, the second supporting plate (320) may have a second supporting plate seating face (321) formed on which the bonding object (2) is secured and supported. Here, the second supporting plate seating face (321) may face the first supporting plate seating face (221).

Meanwhile, the second supporting plate (320) is an element installed above the processing space (S), with the second supporting plate seating face (321) configured to face downward. This may cause a problem of the bonding object (2) seated therein falling due to gravity.

To address this problem, a supporting means to support and secure in place the bonding object (2) may be provided. For example, the second supporting plate (320) may be an electromagnet which, through a magnetic force formed by connection with an external electric connection, can secure the bonding object (2) in the second supporting plate seating face (321) and facilitate ease of attachment and release. The second supporting plate (320) may also be removable from the support shaft (310) and held in place by a magnet.

Alternatively, the supporting means may physically secure the bonding object (2) to the second supporting plate seating face (321), and may secure the bonding object (2) to the second supporting plate (320) through a plurality of securing pins (not illustrated) protruding upward from the second supporting plate seating face (321). Still alternatively, a clamping means or an adhesive means may be used to secure the bonding object (2) to the second supporting plate (320).

That is, the supporting means may be configured in any way so long as it is able to secure the bonding object (2) to the second supporting plate seating face (321).

Meanwhile, the second supporting plate (320), like the first supporting plate (220) explained in the above, may be electrically connected to an external earthing terminal and used as an earthing electrode, forming an electrical field between it and the electrode unit (510) to be explained below to form a plasma atmosphere.

The support shaft drive unit (330) is an element which drives the support shaft (310), and maybe configured in various ways.

The support shaft drive unit (330) may be installed outside the process chamber (100) and connected to the support shaft (310), and, by driving the support shaft (310) from outside the process chamber (100), control the position of the second supporting plate (320).

For example, the support shaft drive unit (330) may, to align the PDMS (1) and the bonding object (2), be able to drive the support shaft (310) in at least one of an X-axis direction, Y-axis direction and Z-axis direction, and Θ-axis direction (R), where the up-down direction of the process chamber (100) is the Z-axis direction.

The support shaft drive unit (330) may be able to rotate the support shaft (310) with respect to an imaginary central axis of the support shaft (310), the imaginary central axis parallel to the Z-axis direction.

That is, the support shaft drive unit (330) may be installed on the upper face of the process chamber (100), and may drive the support shaft (310) in any one of the X-axis direction, Y-axis direction and Z-axis direction.

Said again, the support shaft drive unit (330) can drive the support shaft (310) in at least one of the X-axis direction, Y-axis direction, Z-axis direction and Θ-axis direction, and is of course able to drive the same simultaneously in the respective directions.

In this case, the support shaft drive unit (330) may comprise a Z-axis drive unit (340) for driving the support shaft (310) in the Z-axis direction, a Y-axis drive unit (350) for driving the support shaft (310) in the Y-axis direction, and an X-axis drive unit (360) for driving the support shaft (310) in the X-axis direction.

Further, the support shaft drive unit (330) may additionally comprise a rotator (370) for rotating the support shaft (310).

More specifically, the Z-axis drive unit (340), by driving the support shaft (310) up and down, can cause the bonding object (2) supported by the second support plate (320) to come into contact with or become separated from the PDMS (1).

The Z-axis drive unit (340) is an element which drives the support shaft (310) up and down, and may be configured in various ways.

For example, the Z-axis drive unit (340) may comprise a vertically installed Z-axis drive screw (342), a Z-axis drive block (341) installed on the Z-axis drive screw (342), and a Z-axis drive motor (343) which rotates the Z-axis drive screw (342) to drive the Z-axis drive block (341) up or down.

Meanwhile, in another example, the Z-axis drive unit (340) may drive the support shaft (310) in the vertical Z-axis direction hydraulically, electrically, or magnetically, etc.

The Y-axis drive unit (350), like the Z-axis drive unit (340) explained above, may comprise a Y-axis drive screw (352) installed in the Y-axis direction, a Y-axis drive block (351) installed on the Y-axis drive screw (352), and a Y-axis drive motor (not illustrated) which rotates the Y-axis drive screw (352) to drive the Y-axis drive block (341) in the Y-axis direction.

Further, the X-axis drive unit (360), like the Z-axis drive unit (340) explained above, may comprise an X-axis drive screw (363) installed in the X-axis direction, an X-axis drive block (361) installed on the X-axis drive screw (363), and an X-axis drive motor (362) which rotates the X-axis drive screw (363) to drive the X-axis drive block (361) in the X-axis direction.

Meanwhile, the Y-axis drive unit (350) and the X-axis drive unit (360) may both, like the Z-axis drive unit explained in the above, drive the support shaft (310) hydraulically, electrically or magnetically, etc.

Meanwhile, the rotator (370), which is an element which is coupled to the support shaft (310) and rotates the support shaft (310) with respect to an imaginary central axis of the support shaft (310) parallel to the Z-axis direction, may be configured in various ways.

For example, the rotator (370) may be a motor that is installed in a manner in which it is coupled to the support shaft (310), and rotate the support shaft (310). Any method disclosed in prior art may be used.

Meanwhile, the support shaft (310), to allow it to be driven in at least one of the X-axis direction, Y-axis direction and Z-axis direction, be installed through a through-hole on the top face of the process chamber (100) having an internal diameter greater than the outer diameter of the support shaft (310), and bellows (311), etc., encircling the support shaft (310) may be installed to maintain the processing space (S) as a vacuum.

In addition to the movement of the second support (300) described above, the first support (200) may have an integrated X-axis, Y-axis movement mechanism or means (e.g. comprising a support shaft drive unit with X-axis, Y-axis movement). This advantageously extends the X-axis, Y-axis movement of the first support to facilitate the production of multiple bonded objects or multiple microfluidic substrates in a single processing cycle, comprising multiple alignment, treatment and bonding steps, without the need to remove and reapply vacuum conditions to load/unload bonded substrates from the sealed processing space (S) of the process chamber. Typically, the X-axis, Y-axis movement of the first support (200) is limited to, for example, +/− 12.5 mm. Implementing an X-axis, Y-axis movement on a first support may increase movement to, for example, but not limited to 50 mm-100 mm. This would facilitate the processing of multiple microfluidic substrates or PDMS/bonding objects (1,2) in a single processing cycle, comprising multiple alignment, treatment and bonding steps, without the need to remove and reapply vacuum conditions to load/unload bonded substrates from the sealed processing space (S) of the process chamber. Enabling movement of both the first support (200) and second support (300) advantageously increases the size of substrates to be bonded that may be processed in the chamber without breaking vacuum, facilitates alignment in multiple areas, and also reduces the number of chamber cycles to perform bonding operations on larger or more complex parts. Advantageously, by enabling movement of the first support, multiple substrates may be processed in the process chamber without the need to remove and reapply vacuum conditions to load/unload bonded substrates from the sealed processing space (S) of the process chamber.

The gas injection unit (400) is an element which ejects process gas between the first support (200) and the second support (300), and may be configured in various ways.

For example, the gas injection unit (400) may comprise a spray nozzle (410) installed on the side of the process chamber (100), and a gas supply unit (420) which is connected to the spray nozzle (410) and supplies process gas thereto.

The spray nozzle (410) is an element which is installed inside the process chamber (100) and sprays process gas, and may be configured in various ways.

For example, the spray nozzle (410), for more effective surface modification of the PDMS (1) and conversion of process gas into plasma, may be installed inside the process chamber (100) at a height between the first support (200) and the second support (300), and may spray process gas at a height between the first support (200) and the second support (300).

Meanwhile, at least one spray nozzle (410) may be installed inside the process chamber (100), and the process gas may be argon gas.

The gas supply unit (420) is an element installed outside the process chamber (100) and connected with the spray nozzle (410) to supply process gas, and may be configured in various ways.

The plasma generator (500) is an element which forms a plasma atmosphere within the process chamber (100) for plasmafication of process gas, and may be configured in various ways.

For example, the plasma generator (500) may comprise an electrode unit (510) installed in the processing space (S) at a height between the first support (200) and the second support (300), and a power source (520) which is connected to the electrode unit (510) and supplies RF power to the electrode unit (510).

Further, the plasma generator (500) may additionally comprise a matcher (530) which is installed between the power supply (520) and the electrode unit (510) to control the plasma within the processing space (S), and an insulating member (540) which is installed on the electrode unit (510) for insulation between the electrode (520) and the process chamber (100).

The electrode unit (510) is an element which is installed in the processing space (S) at a height between the first support (200) and the second support (300) to create an electrical potential difference between it and an earthing electrode and thereby form an electrical field, and may be configured in various ways.

For example, the electrode unit (510) may comprise a conductor rod (512) installed to protrude from the inner face of the process chamber (100) at a height between the first support (200) and the second support (300), and an electrode (511) installed at the tip of the conductor rod (512) and having an electrode face parallel to the inner face of the process chamber (100).

Here, the electrode (511) may be installed to have an electrode face oriented toward the first support (200) and the second support (300), and the electrode face may have a net-shaped pattern formed upon it.

The power source (520) is an element which is electrically connected to the electrode unit (510) and supplies RF power to the electrode unit (510), and may be configured in various ways.

The power source (520) is installed outside the process chamber (100), and may be electrically connected to the electrode unit (510).

Further, the power source (520) may supply RF power to the electrode unit (510) so that a plasma atmosphere can be formed inside the processing space (S).

The matcher (530) is an element which is installed between the power source (520) and the electrode unit (510) to control plasma inside the processing space (S), and may be configured in various ways.

For example, the matcher (530) may be a circuit element installed between the power source (520) and the electrode unit (510), and may control the plasma inside the processing space (S) through impedance adjustment.

The insulating member (540) is an element installed on the electrode unit (510) for insulation between the electrode unit (510) and the process chamber (100), and may be configured in various ways.

For example, the insulating member (540) may be installed in a manner that allows the electrode unit (510) to be insulated from the grounded side face of the process chamber (100). More specifically, in a case wherein a conductor rod (512) is installed through the side face of the process chamber (100), [the insulating member] may be installed between the conductor rod (512) and the process chamber (100) to insulate the electrode (510) and the process chamber (100) from each other.

The insulating member (540) may be any material disclosed in prior art, so long as it is able to electrically insulate the electrode unit (510) and the process chamber (100).

The vacuum unit (600) is an element provided to maintain the processing space (S) as a vacuum, and may be configured in various ways.

For example, the vacuum unit (600) may comprise a vacuum pump (610) installed outside the process chamber (100), and an exhaust pipe (620) for exhaust of gas from the processing space (S), with one end connected to the processing chamber (100) and the opposite end connected to the vacuum pump (610).

Naturally, the vacuum unit (600) may be used not only for maintaining a vacuum in the processing space (S) of the process chamber (100), but also as an element for adjusting pressure in the processing space (S).

Meanwhile, the vacuum unit (600), by keeping the inside of the process chamber (100) in a vacuum state, prevents generation of static charge during surface treatment of the PDMS (1) and the bonding object (2) with plasma, in turn keeping foreign material from sticking to the surface and reducing adhesive force.

That is, keeping the processing space (S) within the process chamber (100) in a vacuum state, compared to the same process under atmospheric pressure, has the benefit of improving adhesion by preventing sticking of foreign material, etc.

The vacuum pump (610) is an element installed outside the process chamber (100) and which is in communication with the processing space (S) through the exhaust pipe (620) to discharge gas from within the processing space (S).

Here, the vacuum pump (610) may be any pump disclosed in prior art so long as it is able to keep the processing space (S) within the process chamber (100) in a vacuum state. In particular, it may allow for surface modification of the PDMS (1) to occur using plasmafied process gas in the processing space (S) under vacuum.

The aligning camera unit (700) is an element which is installed on an imaginary straight line outside the process chamber (100) connecting the PDMS (1) and the bonding object (2) to check the alignment between the PDMS (1) and the bonding object (2), and may be configured in various ways.

The PDMS (1) and the bonding object (2) according to the present invention are bonded by moving the second support plate (320) with the surface of the PDMS (1) modified. In this case, alignment between the two objects may be a problem.

Accordingly, the PDMS bonding apparatus according to the present invention, as illustrate din FIG. 1, may further comprise an aligning camera unit (700) which is installed on an imaginary straight line outside the process chamber (100) connecting the PDMS (1) and the bonding object (2) to check the alignment between the PDMS (1) and the bonding object (2).

Figure 6:
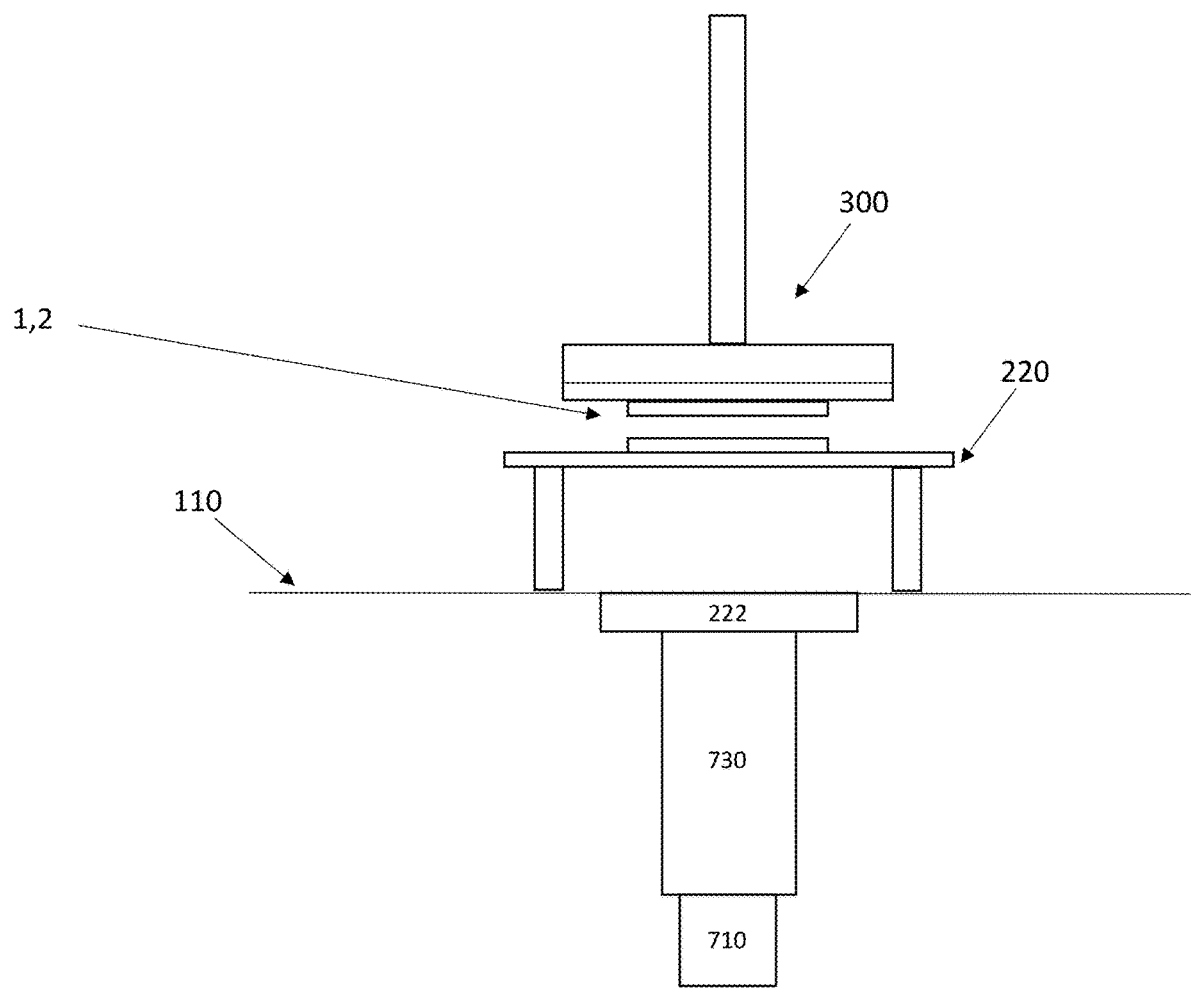
FIG. 6 is a cross-section showing the PDMS bonding apparatus of the invention.

The aligning camera unit (700) may comprise an alignment camera (710) which is installed outside the process chamber (100) for real-time monitoring of alignment between the PDMS (1) and the bonding object (2), and a support (720) for installing the alignment camera (710). Alternatively, as shown in FIG. 6, the aligning camera unit (700) may comprise an alignment camera (710) and lens (730) in line with or adjacent to the chamber viewport (130).

The alignment camera (710) is an element for visually checking the alignment between the PDMS (1) and the bonding object (2), and may be configured in various ways.

For example, the alignment camera (710) may be an apparatus which uses charge-coupled devices (CCDs) to convert images into electrical signals which are saved on a memory medium as digital data.

More specifically, the alignment camera (710) may be installed in a fixed manner on a support (720) which protrudes downward from the bottom face of the process chamber (100), separated by a certain distance from the bottom face of the process chamber (100), and may film the PDMS (1) through the chamber view port (130) provided at the bottom face of the process chamber (100).

Meanwhile, the PDMS (1) is a transparent material through which light can pass. Therefore, the PDMS (1) and the bonding object (2) positioned opposite the PDMS (1) can be filmed together, and thereby the alignment between the bonding object (2) and the PDMS (1) can be checked in real time.

Meanwhile, for checking alignment between the bonding object (2) and the PDMs (1), positioning pins (not illustrated) or position markers may be formed on at least one of the bonding object (2) and the PDMS (1), and through alignment of the positioning pins or position markers, the alignment status of the bonding object (2) and the PDMS (1) can be checked.

By checking alignment between the PDMS (1) and the bonding object (2) through the alignment camera, and adjusting the position of the bonding object using the second shaft drive unit (330) if there is a need for position adjustment, the bonding object (2) and the PDMS (1) can be aligned.

Figure 5:
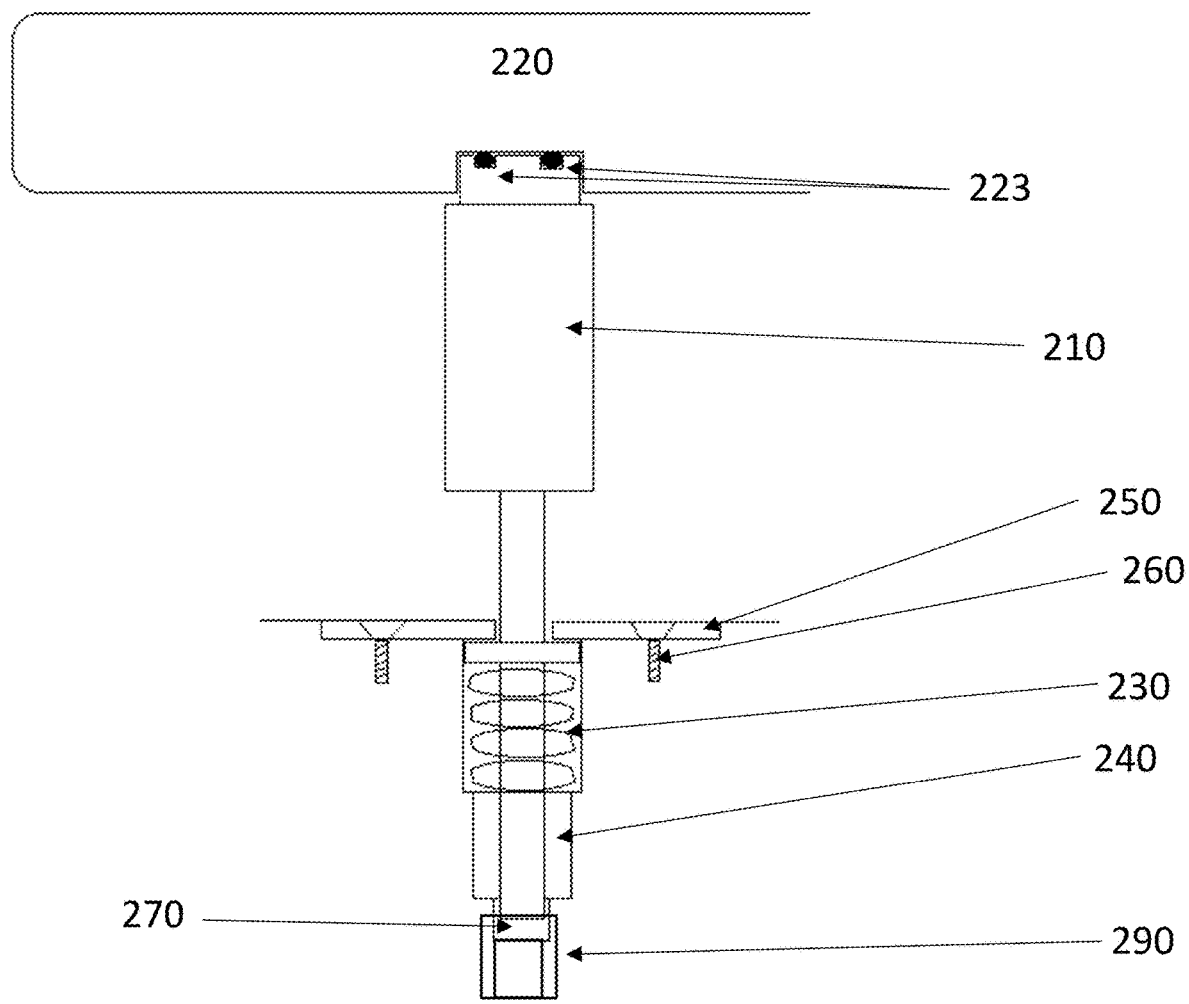
FIG. 5 is an expanded cross section showing the supporting pins of the PDMS bonding apparatus of the invention.

FIG. 5 is an enlarged view of a supporting pin (210) installed on the bottom inner face of the process chamber (100) comprising a resilient means in the form of a compression spring (230). This resilient means is designed to act as a stabilizer and mechanical shock absorber during the bonding process where there can be considerable force between the first (200) and second (300) supports. This ideally ensures that the pressure on the first supporting plate (220) is reduced and the bonding process can be completed safely. In this figure the compression spring is supported by a linear bush (240) and both are located within the inner face of the process chamber (100). This figure also shows supporting pin covers (250) which fix the supporting pin to the chamber body (110) with screws (260). These supporting pin covers (250) provides a mechanical limit on the position of the supporting pin (210) within the process chamber. Also shown is a force transducer (290) and a limit switch (270) located at the base of the supporting pin (210). The force transducer detects and measures the contact between the first and second supports (200, 300) and the limit switch (270) prevent the second support (300) from exceeding the required force/pressure required for the bonding step. The limit switch, which may be a mechanical, optical or proximity device, may be connected to drive motor(s), indicator light, or a software monitoring system. It will be understood that the transducer may also be integral to the second support. An alternative method to monitor the mechanical end or stop position to prevent the drive from damaging the first support, involves monitoring the drive motor current in order to monitor an increase in drive motor force which occurs when the motor has come to the end of the range of movement.

Feedback is used to ensure that the alignment of the substrates is highly accurate, to a degree which is not feasible using manual alignment or bonding methods. Feedback on position is used to deliver positional accuracy leading to accurate alignment. For example, one or more position encoders may also be used to monitor the position of the second support and first support where automated with high accuracy.

FIG. 6 shows an alternative setup of the aligning camera unit (700) of FIGS. 1-4. This figure shows an aligning camera (710) with separate lens (730) in line with or adjacent to the viewport (222).

Figure 7:
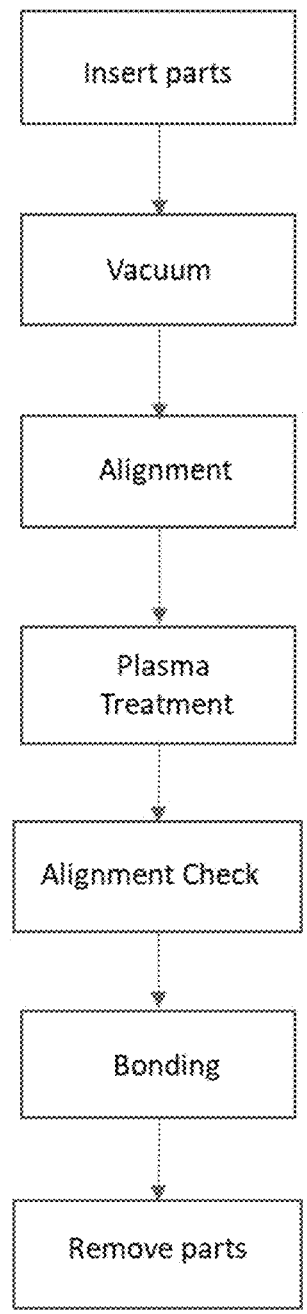
FIG. 7 is a flowchart outlining the process of the invention.

FIG. 7 provides a flowchart of the improved process of the invention comprising the following steps:
  Placing the first and second microfluidic substrate (1,2) into the process chamber (100);
  Applying a vacuum;
  Aligning the first and second microfluidic substrate (1,2);
  Plasma treatment step;
  Optional post-treatment alignment check;
  Bonding step to form a bonded substrate; and
  Release bonded substrate and remove from process chamber (100).

Additionally, the bonding of multiple substrates per single processing cycle is facilitated by mounting multiple substrates (e.g. two or more first microfluidic substrate or PDMS (1)) on the first support (200) and moving each substrate into position for alignment and bonding using the X-axis, −Y axis movement capability of the first support (200) during the bonding step.

Alternatively, multiple substrates (e.g. two or more second microfluidic substrate or bonding object (2)) may be attached to the second support (300). During the bonding step, the second support (300) may be rotated to ensure each separate substrate is bonded.

In this manner the process for bonding multiple substrates may involve:
  1. Placing two or more sets or pairs of first and second microfluidic substrates (1,2) to the process chamber (100);
  2. Applying a vacuum;
  3. Aligning a first set of first and second microfluidic substrate (1,2);
  4. Plasma treatment step;
  5. Optional post-treatment alignment check;
  6. Bonding step;
  7. Aligning a second set of first and second microfluidic substrate (1,2) and repeating steps 4- to 6;
  8. Repeating step 7 for a third, fourth, fifth.to n set of first and second microfluidic substrates (1,2); and 9. Removing the vacuum, releasing the two or more bonded substrates and removal from process chamber (100).

The number of substrates that may be accommodated in this process for bonding multiple substrates will depend on the devices being fabricated, the number of layers in each device, and the size of the first support (200), second support (300), and process chamber (100).

This process may also be used to fabricate multi-layer substrates. In this aspect, two substrates are bonded initially, and each bonded substrate may then be used as the starting substrate for an additional bonding step. This process is repeated for each new substrate to be bonded. This process is limited by the height between the first support (200) and second support (300) at their mechanical end positions.

Figure 8:
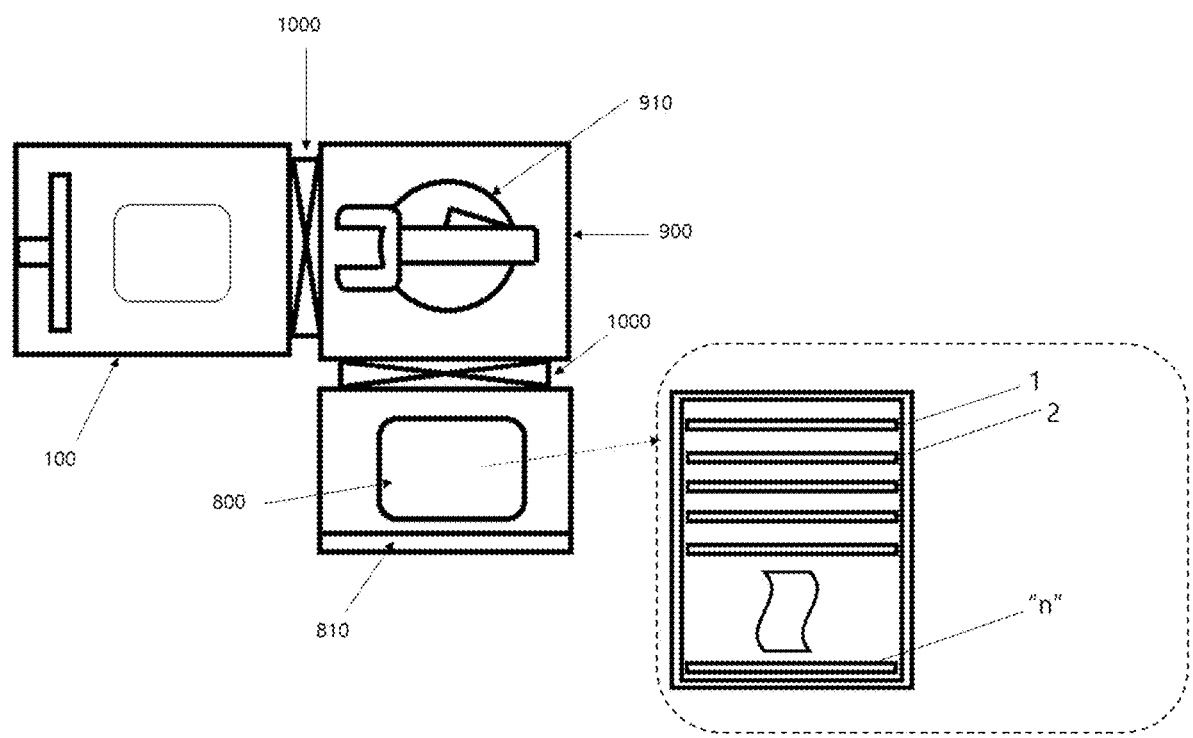
FIG. 8 is a top view of a system comprising the PDMS bonding apparatus of the invention, a transfer module and a storage module.

FIG. 8 shows a top view of a system comprising 3 modules—the PDMS bonding apparatus of the invention (100), a transfer module (900) with robotic arm (910) and a substrate (1,2) storage module (800) and is designed to automate the delivery of substrates into the process chamber (100) for alignment, treatment and bonding. An isolation valve (1000) is present between each module. The storage module (800) comprises multiple substrate 'cassettes' or holders, each cassette or holder comprising a set of first microfluidic substrate/PDMS (1) and a second microfluidic substrate/bonding object (2). The transfer module (900) transports each cassette comprising a first microfluidic substrate/PDMS (1) and a second microfluidic substrate/bonding object (2) between the storage module (800) and the process chamber (100). All 3 modules may be held under vacuum to ensure pressure equalization between the process chamber (100), transfer module (900) and storage module (800).

This modular system advantageously facilitates automatic multi-substrate (e.g. cassettes/holders comprising sets of first microfluidic substrate/PDMS (1) and a second microfluidic substrate/bonding object (2)) transfer to and from the storage module (800) to the process chamber (100), plasma treatment and bonding. Multiple substrate sets of first microfluidic substrate/PDMS (1) and a second microfluidic substrate/bonding object (2)) may be placed into the storage module (800) at the same time (1,2,1,2,1,2 . . . *n*). These substrates may be the same or different materials. The transfer module (900) comprising a robotic arm (910) facilitates the automated transfer of the substrates (first microfluidic substrate/PDMS (1) and a second microfluidic substrate/bonding object (2)) from the storage module to the PDMS bonding apparatus and enables a fully automated process useful in the manufacture of microfluidic devices. A typical process using this modular system involves the following steps:
1. Loading two or more sets of first microfluidic substrate/PDMS (1) and a second microfluidic substrate/bonding object (2) into each cassette/holder in the storage module (800);
2. Pump down all 3 modules to a vacuum;
3. Transfer a first set of first microfluidic substrate/PDMS (1) and a second microfluidic substrate/bonding object (2) from the storage module (800) to the transfer module (900) and then to the plasma chamber (100) via the robotic arm (910) and the opening and closing of appropriate isolation valves (1000);
4. Finalise vacuum conditions;
5. Align and bond the first set of first microfluidic substrate/PDMS (1) and a second microfluidic substrate/bonding object (2);
6. Remove bonded substrate/bonding object from plasma chamber (100) and place back in the cassette/holder;
7. Repeat the above steps for all substrates in the storage module (800).

Advantageous features of the automation of the substrate handling for first and second support are expanded on below:

Insertion into Process Chamber:
1) The first substrate together with the first supporting plate is placed in the process chamber on the first support shaft by the robotic arm.
2) The second supporting plate is ideally metallic and this enables attachment of the second substrate via a magnet. The second supporting plate with bound second substrate is inserted into the process chamber (100) by the robotic arm and the second supporting plate is moved through 180 degrees, so that the supporting plate attaches to the support shaft and the substrate is facing the first support.
3) For a conventional 2 layer bonded substrate, a set or pair of first and second supporting plates with substates are loaded separately and sequentially into the process chamber. The substrates are aligned, surface treated and bonded;
4) For a multi-layer bonded substrate, once the substrates of step 3 are bonded, a second supporting plate with bound substrate is inserted into the process chamber (100) by the robotic arm and the second supporting plate is moved through 180 degrees, so that the supporting plate attaches to the support shaft and the substrate is facing the first support. The substrates are aligned, surface treated and bonded.

Removal from Process Chamber:
1) To remove a bonded substrate or multi-layered substrate, the second support electromagnet is activated which overcomes the magnetic field of the magnet and releases the second supporting plate;
2) The second support retracts in the Z-axis to allow room for the robotic arm;
3) The isolation valve is opened, and the robotic arm lifts the first supporting plate, bonded substrate and second supporting plate together and transfers it to the storage cassette or holder.

The invention will now be described by the following non-limiting statements:
1. A PDMS bonding apparatus comprising:
 a process chamber (100) forming a sealed processing space (S) for bonding of PDMS (polydimethylsiloxane);
 a first support (200) installed in the process chamber (100) and which supports the PDMS (1);
 a second support (300) installed in the process chamber (100) opposing the first support (200) and which supports a bonding object (2) which is bonded to the PDMS (1);
 a gas injection unit (400) which ejects process gas between the first support (200) and the second support (300), and;
 a plasma generator (500) which creates a plasma atmosphere within the process chamber (100).
2. The PDMS bonding apparatus according to statement 1, characterized in that it additionally comprises a vacuum pump (610) which is installed in a manner connected with the process chamber (100) so that the processing space (S) maintains a vacuum state.
3. The PDMS bonding apparatus according to statement 1, characterized in that the first support (200) and the second support (300) are installed vertically inside the process chamber (100), at the top and the bottom, respectively.

4. The PDMS bonding apparatus according to statement 3, characterized in that the first support (200) comprises a plurality of supporting pins (210) installed on the bottom inner face of the process chamber (100), and a first supporting plate (220) which is supported by the plurality of supporting pins (210) and on which the PDMS (1) is seated.

5. The PDMS bonding apparatus according to statement 3, characterized in that the second support chamber (300) comprises:
- a support shaft (310) which is installed to penetrate through the upper face of the process chamber (100);
- a second supporting plate (320) installed in the processing space (S) connected to the support shaft (310) and to which the bonding object (2) is fixed, and;
- a support shaft drive unit (330) which drives the support shaft (310).

6. The PDMS bonding apparatus according to statement 5, characterized in that the support shaft drive unit (330), to align the PDMS (1) and the bonding object (2), is able to drive the support shaft (310) in at least one of an X-axis direction, Y-axis direction and Z-axis direction, where the up-down direction of the process chamber (100) is the Z-axis direction.

7. The PDMS bonding apparatus according to statement 5, characterized in that the support shaft drive unit (330) is able to rotate the support shaft (310) with respect to an imaginary central axis of the support shaft (310), the imaginary central axis parallel to the Z-axis direction.

8. The PDMS bonding apparatus according to statement 1, characterized in that the plasma generator (500) may comprises an electrode unit (510) installed in the processing space (S) at a height between those of the first support (200) and the second support (300), and a power source (520) which is electrically connected to the electrode unit (510) and which supplies RF power to the electrode unit (510).

9. The PDMS bonding apparatus according to statement 8, characterized in that the plasma generator (500) comprises a matcher (530) which is installed between the power source (520) and the electrode unit (510) and which controls the plasma within the processing space (S).

10. The PDMS bonding apparatus according to statement 1, characterized in that it additionally comprises an aligning camera unit (700) which is installed outside the process chamber (100) on an imaginary straight line linking the PDMS (1) and the bonding object (2) and which checks the alignment of the PDMS (1) and the bonding object (2).

The foregoing explains only some of the preferred embodiments of the present invention. The scope of the present invention shall not be interpreted as limited to the foregoing embodiments, and all technical ideas sharing the same fundamentals as the technical idea of the present invention as explained in the foregoing shall be included in the scope of the present invention.

EXPLANATION OF SYMBOLS

100: Process chamber
200: First support
300: Second support
400: Gas injection unit
500: Plasma generator
600: Vacuum pump
700: Aligning camera unit
800: Storage module
900: Transfer module
1000: Isolation valve

The invention claimed is:

1. A PDMS bonding apparatus comprising:
- a process chamber (100) forming a sealed processing space(S) for bonding of PDMS (polydimethylsiloxane) with a chamber viewport (130);
- a first support (200) comprising a first support plate (220), the first support (200) being installed in the process chamber (100) and which supports the PDMS (1);
- a second support (300) comprising a second support plate (320), the second support (200) being installed in the process chamber (100) opposing the first support (200) and which supports a bonding object (2) which is bonded to the PDMS (1);
- a gas injection unit (400) which ejects process gas between the first support (200) and the second support (300),
- a plasma generator (500) which creates a plasma atmosphere within the process chamber (100), and a vacuum pump (610) which is installed in a manner connected with the process chamber (100) so that the processing space(S) maintains a vacuum state,
- an aligning camera unit (700) which is installed outside the process chamber (100) on an imaginary straight line linking the PDMS (1) and the bonding object (2) and wherein the aligning camera unit (700) checks alignment of the PDMS (1) and the bonding object (2);
- and wherein the first support plate (220) and the second support plate (320) are optically transparent.

2. The PDMS bonding apparatus according to claim 1, characterized in that the first support (200) and the second support (300) are installed vertically inside the process chamber (100), with the first support (200) installed at a bottom of the process chamber (100) and the second support (300) installed at a top of the process chamber (100).

3. The PDMS bonding apparatus according to claim 2, characterized in that the first support (200) comprises a plurality of supporting pins (210) installed on a bottom inner face of the process chamber (100), and the first supporting plate (220) which is supported by the plurality of supporting pins (210) and on which the PDMS (1) is seated.

4. The PDMS bonding apparatus according to claim 3 wherein the plurality of supporting pins (210) comprises one or more resilient member supporting pins.

5. The PDMS bonding apparatus according to claim 1, characterized in that the second support comprises:
- a support shaft (310) which is installed to penetrate through an upper face of the process chamber (100); and
- the second supporting plate (320) which is installed in the processing space(S) connected to the support shaft (310) and to which the bonding object (2) is fixed; and
- a support shaft drive unit (330) which drives the support shaft (310).

6. The PDMS bonding apparatus according to claim 1 wherein the second support (300) comprises a support shaft (310) and a support shaft drive unit (330), characterized in that the support shaft drive unit (330), to align the PDMS (1) and the bonding object (2), is able to drive the support shaft (310) in at least one of an X-axis direction, Y-axis direction and Z-axis direction, wherein the Z-axis direction is an up-down direction of the process chamber (100).

7. The PDMS bonding apparatus according to claim 1 wherein the second support (300) comprises a support shaft (310) and a support shaft drive unit (330), characterized in that the support shaft drive unit (330) is able to rotate the support shaft (310) with respect to an imaginary central axis parallel to a Z-axis direction of the support shaft (310).

8. The bonding apparatus according to claim 1 wherein the first support (200) has an X-axis, Y-axis movement mechanism.

9. The PDMS bonding apparatus according to claim 1, characterized in that the plasma generator (500) comprises an electrode unit (510) installed in the processing space(S) at a height between those of the first support (200) and the second support (300), and a power source (520) which is electrically connected to the electrode unit (510) and which supplies RF power to the electrode unit (510).

10. The PDMS bonding apparatus according to claim 9 wherein the electrode unit (510) is fixedly installed on an inner face of the process chamber at a position between the first support (200) and the second support (300).

11. The PDMS bonding apparatus according to claim 9, characterized in that the plasma generator (500) comprises a matcher (530) which is installed between the power source (520) and the electrode unit (510) and which controls the plasma within the processing space(S).

12. The PDMS bonding apparatus according to claim 1, further comprising a plurality of supporting pins (210) installed on a bottom inner face of the process chamber (100), further comprising one or more force transducers (290) located in proximity to the plurality of supporting pins (210) and/or the second support (300).

13. A process for the preparation of a bonded substrate comprising PDMS (1) and a bonding object (2) comprising; providing the PDMS bonding apparatus of claim 1, using said PDMS bonding apparatus to perform the following steps: an alignment step to align the PDMS (1) and the bonding object (2); a plasma surface treatment step; and a bonding step; which take place under the vacuum within the sealed processing space(S) of the process chamber (100).

14. The process according to claim 13 wherein the alignment step, plasma surface treatment step and bonding step are sequential.

15. The process according to claim 13 further comprising a post-treatment alignment verification step prior to the bonding step.

16. The process according to claim 15 wherein the duration between the plasma surface treatment step, the post-treatment alignment step and the bonding step is minimized.

17. The process according to claim 13 further comprising a release step where the process chamber (100) is vented to atmospheric pressure and the bonded substrate is released by the first or second support (200, 300).

18. The PDMS bonding apparatus according to claim 1, wherein the first and second support plates are made of quartz or other rigid transparent material.

19. The PDMS bonding apparatus according to claim 1, wherein the aligning camera unit comprises an alignment camera (710) adjacent to the chamber viewport (130).

20. The PDMS bonding apparatus according to claim 1, wherein the aligning camera unit (700) comprises an alignment camera (710) and lens (730) in line with or adjacent to the chamber viewport (130).

21. The PDMS bonding apparatus according to claim 1 wherein the second support (300) comprises a support shaft (310) and a support shaft drive unit (330), characterized in that the support shaft drive unit (330) is able to drive the support shaft (310) in at least one of an X-axis direction, Y-axis direction and Z-axis direction, and O-axis direction (R), wherein the Z-axis direction is an up-down direction of the process chamber (100).

* * * * *